United States Patent [19]

Kai et al.

[11] Patent Number: 5,434,795
[45] Date of Patent: Jul. 18, 1995

[54] METHOD OF FORMING PATTERN HAVING OPTICAL ANGLE IN CHARGED PARTICLE EXPOSURE SYSTEM

[75] Inventors: Junichi Kai, Tokyo; Hiroshi Yasuda, Yokohama; Kazutaka Taki, Kawasaki; Kenichi Miyazawa, Kokubunji, all of Japan

[73] Assignee: Fujitsu Limited, Kawasaki, Japan

[21] Appl. No.: 286,254

[22] Filed: Aug. 8, 1994

Related U.S. Application Data

[63] Continuation of Ser. No. 123,036, Sep. 20, 1993, abandoned, which is a continuation of Ser. No. 1,396, Jan. 6, 1993, abandoned, which is a continuation of Ser. No. 640,596, Jan. 11, 1991, abandoned.

[30] Foreign Application Priority Data

Jan. 11, 1990 [JP] Japan ................................ 2-2567

[51] Int. Cl.$^6$ .......................................... H01J 37/302
[52] U.S. Cl. .................................... 364/489; 364/488; 250/492.2
[58] Field of Search ................ 364/490, 489, 488; 250/398, 491.1, 492.2, 396 R, 492.22

[56] References Cited

U.S. PATENT DOCUMENTS

| | | | |
|---|---|---|---|
| 4,387,433 | 6/1983 | Cardenia et al. | 364/491 |
| 4,530,064 | 7/1985 | Takigawa et al. | 364/491 |
| 4,532,598 | 7/1985 | Shibayama et al. | 364/491 |
| 4,538,232 | 8/1985 | Koyama | 364/491 |
| 4,789,945 | 12/1988 | Nijima | 364/491 |
| 4,820,928 | 4/1989 | Ooyama et al. | 364/491 |
| 4,878,177 | 10/1989 | Ikenaga et al. | 364/491 |
| 4,996,434 | 2/1991 | Tanaka | 364/491 |

Primary Examiner—Vincent N. Trans
Attorney, Agent, or Firm—Staas & Halsey

[57] ABSTRACT

A charged particle exposure system uses a method for accurately and efficiently generating a required pattern having an optional angle $\theta$. The method uses a reference isosceles right triangle. According to the reference triangle, a plurality of rectangular beams are formed. Each of the rectangular beams is multiplied by $\tan \theta$ of the optional angle $\theta$, thereby preparing data of beams necessary for forming the required pattern.

10 Claims, 13 Drawing Sheets

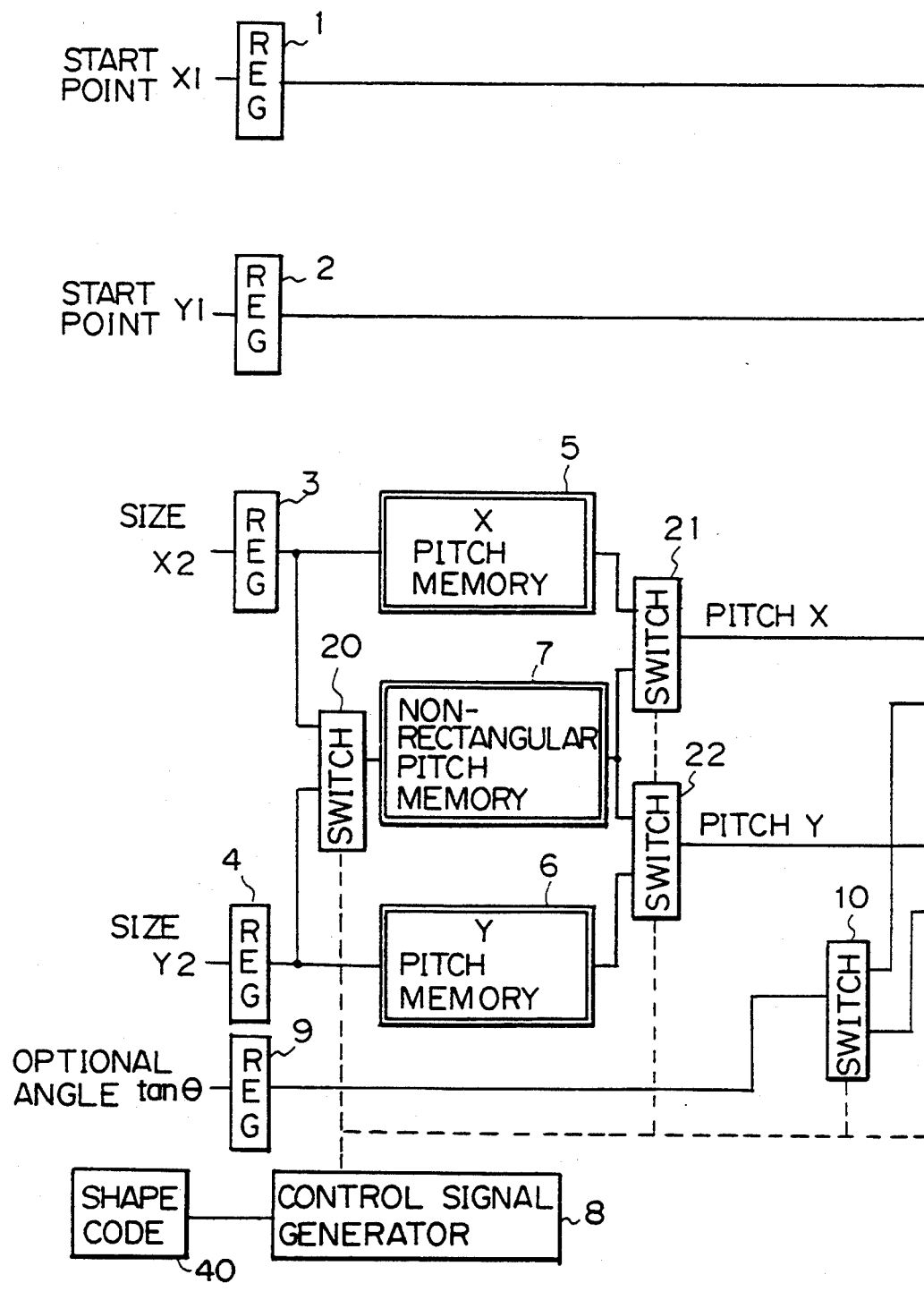

| Fig. 2A | Fig. 2B |

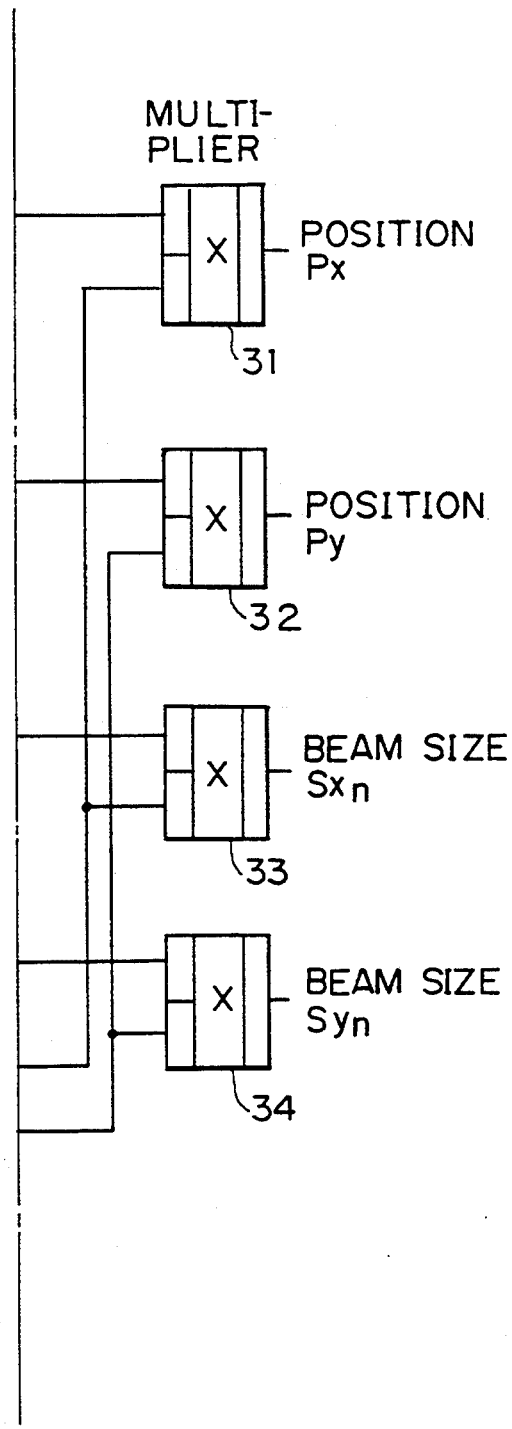

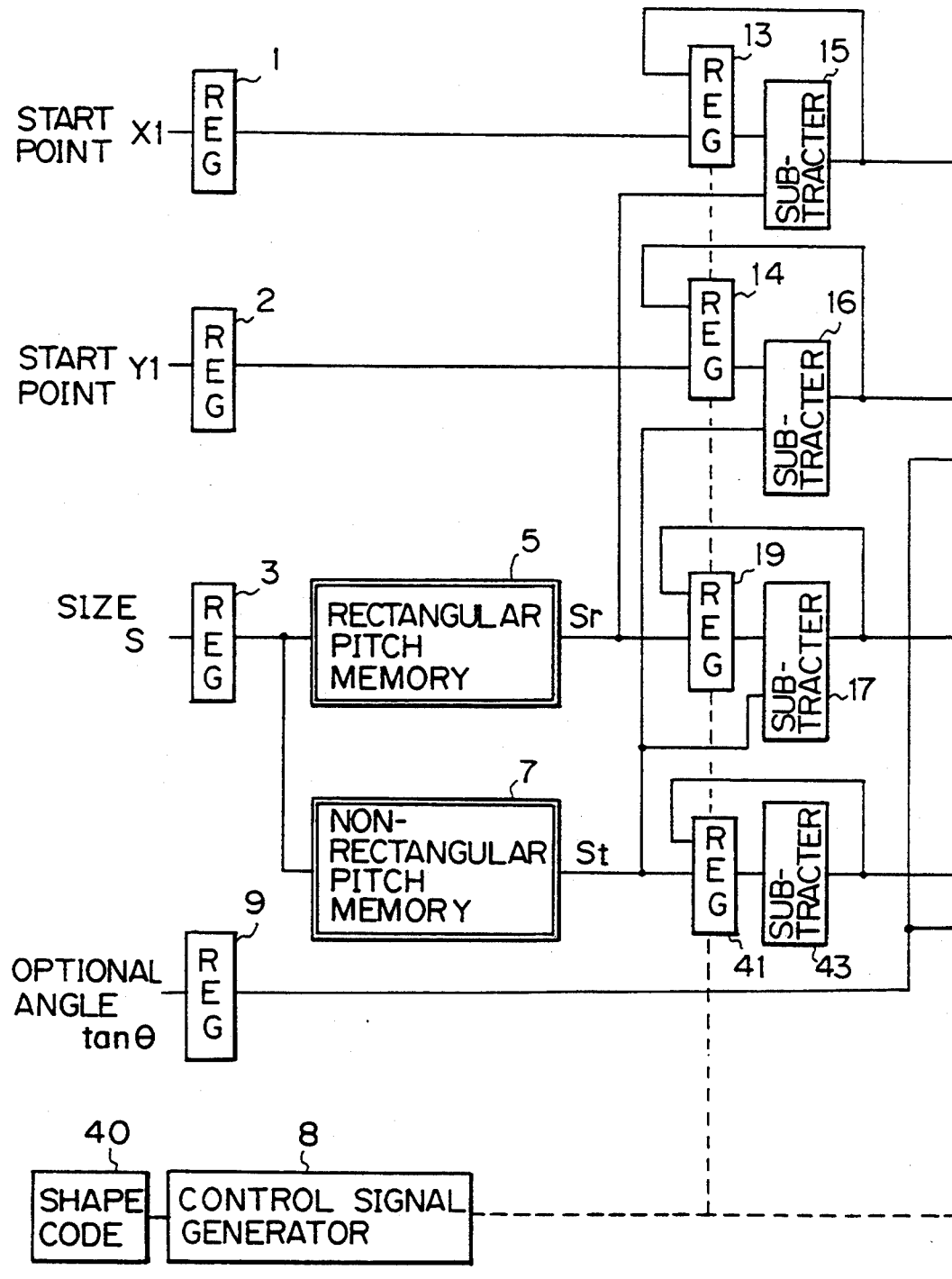

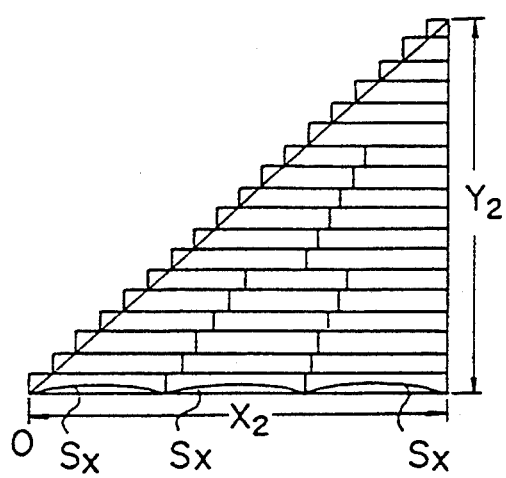
(A) X-SCAN
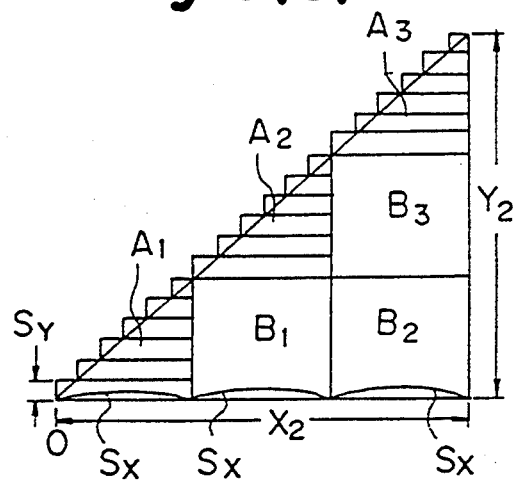
(C) X-SCAN
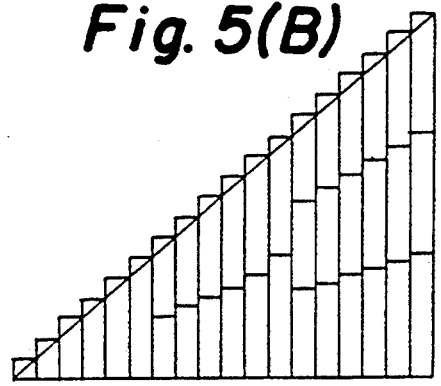
(B) Y-SCAN
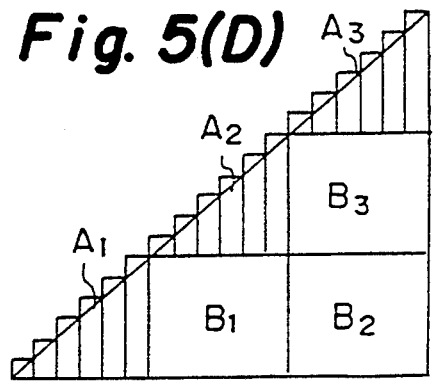
(D) Y-SCAN (B) X-SCAN

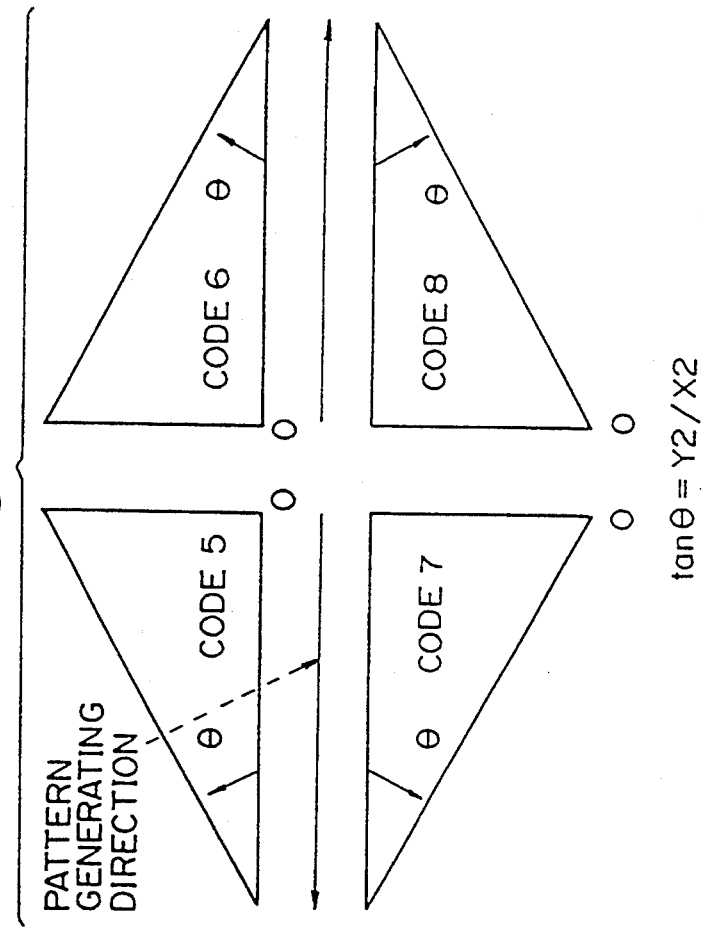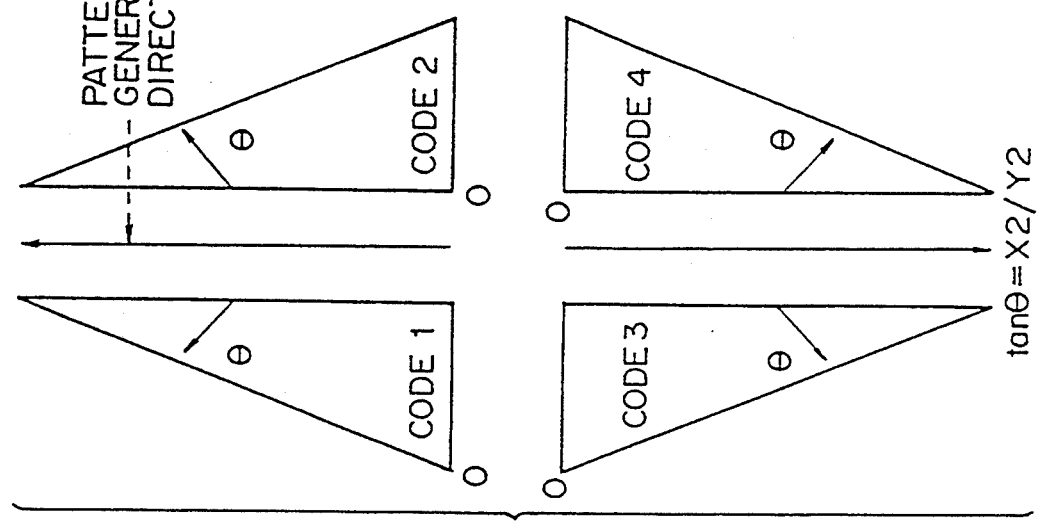

SMALL TRIANGLE (REFERENCE PATTERN)
(A)

SMALL TRIANGLE (PATTERN OF OPTIONAL ANGLE)
(B)

METHOD OF FORMING PATTERN HAVING OPTICAL ANGLE IN CHARGED PARTICLE EXPOSURE SYSTEM

This application is a continuation of applicaiton Ser. No. 08/123,036, filed Sep. 20, 1993, now abandoned, which is a continuation of application Ser. No. 08/001,396, filed Jan. 6, 1993, now abandoned, which is a continuation of application Ser. No. 07/640,596, filed Jan. 11, 1991, now abandoned.

BACKGROUND OF THE INVENTION

1. Field of the Invention

The present invention relates to a method of forming a pattern having an optional angle in a charged particle exposure system.

2. Description of the Related Art

In recent years, integrated circuits become more highly more integrated with more functions and are widely used in computers, telecommunications equipment, machine controllers, etc., in all industrial fields.

The high integration and improved functions of the ICs are due to improvements in fine processing techniques, particularly an optical exposure technique which can achieve a precision of submicron order. It is, however, difficult for the optical exposure technique to open very small electrode windows and realize a positioning accuracy of less than 0.15 micrometers.

For such fine processing with a precision of less than 0.15 micrometers, a charged particle exposure technique such as an electron beam exposure technique is employed.

In the charged particle exposure technique, a conventional pattern generating method using a variable rectangular beam deals only with patterns of rectangles, isosceles right triangles, and parallelograms of 45 degrees.

To further integrate a memory such as a DRAM, the area of each memory cell must be reduced. It is, however, impossible to reduce areas with patterns of rectangles and non-rectangles (triangles, parallelograms, and trapezoids). It is, therefore, required to write patterns having optional angles.

A conventional method of generating patterns having optional angles other than 45 degrees will be explained with reference to FIG. 9 which shows a standard type electron beam exposure system.

At first, a pattern designer prepares many patterns having optional angles other than 45 degrees, using CAD, etc. The prepared patterns are stored in a memory such as a magnetic tape 53 and a magnetic disk 52. In accordance with an instruction from a computer 51, a necessary pattern is selected from the memory and stored in a data memory 55. The pattern stored in the data memory 55 is supplied to an exposure unit 58, 61 through a pattern generator 56 and a pattern correcting circuit 57. These operations take place for each pattern so that it may take a long time from the step of selecting patterns to the step of exposing. Since it is necessary to prepare and store all necessary patterns (particularly triangular patterns) having necessary angles, this method requires a very large memory capacity. Since the number of triangles having optional angles is extremely large, the exposure system must have a complicated controlling system of large circuit scale.

SUMMARY OF THE INVENTION

An object of the present invention is to provide a pattern generating method that can solve the problems of the conventional techniques, and accurately and easily generate patterns having optional angles.

In order to accomplish the object, the present invention provides a method for generating a required pattern having an optional angle. This method is applied to a charged particle exposure system having a memory means for storing dimensional data of an input pattern, a memory means for storing start-point coordinate data of the input pattern, a pitch memory for determining dimensions in scanning and non-scanning directions of a maximum rectangular beam for the input pattern according to pattern rules, a means for calculating coordinates of at least one rectangular beam according to the dimensional data stored in the pitch memory and the start-point coordinate data stored in the memory means, and a multiplier for independently changing at least one of the dimensions, respectively along an X or Y axis and the start-point coordinates of the rectangular beam according to optional angle generating data.

The method comprises the steps of selecting a reference pattern of predetermined specific shape according to the required pattern; specifying the dimensions and start-point coordinates of the reference pattern; calculating the dimensional and coordinate data of at least one rectangular beam needed for generating the reference pattern; processing the results of the calculation using the multiplier and data related to the optional angle; and generating the required pattern having the optional angle according to the processing results.

The present invention uses a reference pattern such as an isosceles right triangle in generating a required pattern having an optional angle $\theta$, and prepared rectangular beams for the reference pattern. The coordinates and dimensions of the rectangular beams are multiplied by data related to the optional angle, i.e., $\tan \theta$, in multipliers, thereby providing data for generating the required pattern. Without complicated control systems, the present invention can precisely generate the required pattern having the desired optional angle.

BRIEF DESCRIPTION OF THE DRAWINGS

FIG. 5A to 5D are plots of an example of a reference triangle;

FIG. 7 is a view showing triangles having an optional angle and shape codes;

DESCRIPTION OF THE PREFERRED EMBODIMENTS

Embodiments of the present invention will be explained with reference to the drawings.

The arrangement and operation of a charged particle exposure system of standard type to which the present invention may be applied will be explained briefly with reference to FIG. 9.

Figure 9:
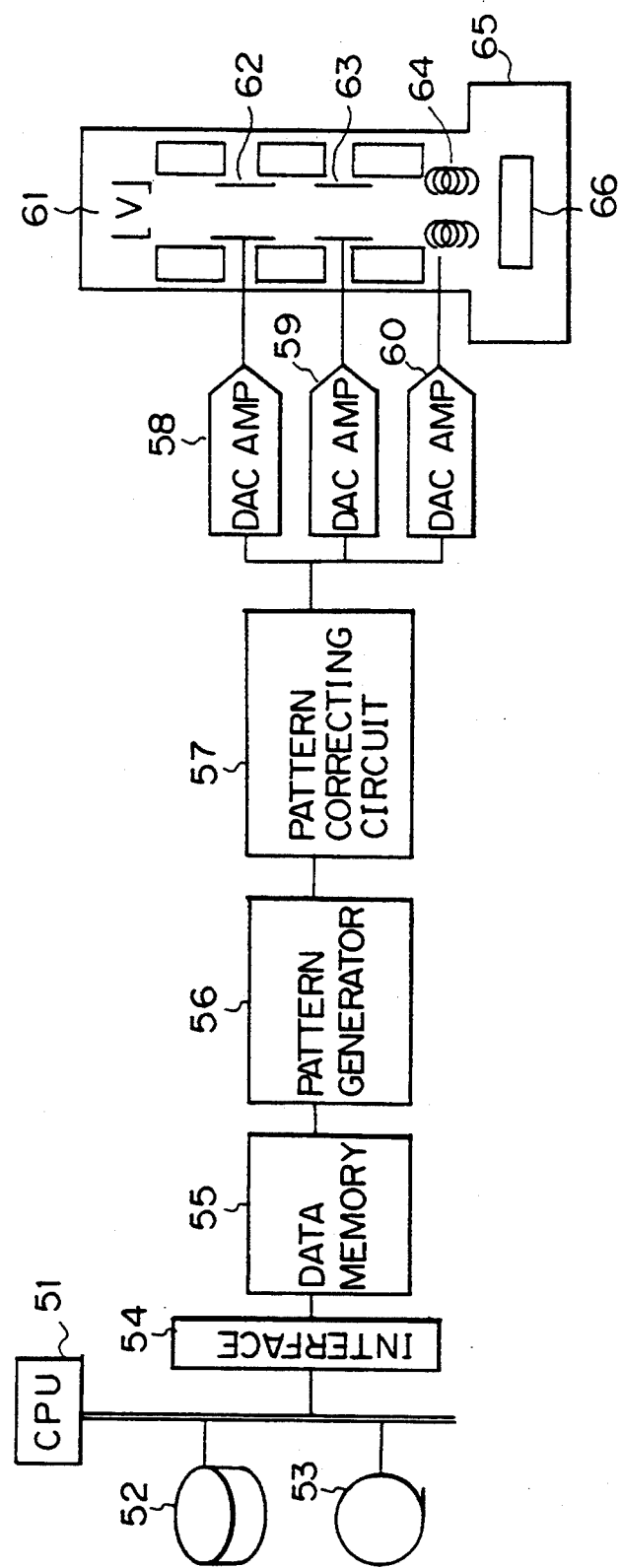
FIG. 9 is a schematic view showing a standard type charged particle exposure system.

In FIG. 9, the exposure system 61 has a sample table 66 on which a sample such as a wafer is placed. Standard patterns with angles of 90 and 45 degrees are formed on the sample with charged particle beams. A column 65 of the exposure system accommodates an electron gun 61 and the sample table 66 between which a proper optical system is disposed. The optical system has a beam size adjuster 62 for adjusting the size of a rectangular beam, a subdeflector 63, and a main deflector 64.

A CPU 51 serving as a pattern controller reads necessary data from a data memory, such as a disk 52 and a tape 53, which store pattern data (the shapes, sizes, and coordinates of patterns), and stores the read data in a data memory 55, serving as a data buffer, through an interface 54. The data stored in the data memory 55 are passed through a pattern generator 56 and a pattern correcting circuit 57, and provided to digital-to-analog converters 58, 59, and 60.

The digital-to-analog converters 58, 59, and 60 have amplifiers and supply necessary data to the beam size adjuster 62, subdeflector 63, and main deflector 64, respectively. Thereafter, the exposure system emits beams to expose the sample.

This sort of exposure system usually writes a non-rectangular pattern on the sample according to one of the following two prior-art techniques:

(1) As shown in FIGS. 5(A) and 5(B), the non-rectangular pattern is divided into narrow rectangles. Each of the narrow rectangles is further divided by a maximum beam size into rectangular segments according to pattern rules. Thereafter, the narrow rectangles are sequentially processed and written, by exposure, one by one.

(2) As shown in FIGS. 5(C) and 5(D), the non-rectangular pattern is first divided into rectangles (particularly squares) and small triangles according to the pattern rules. Each of the small triangles is then divided into narrow rectangles.

Here, the pattern rules determine a maximum beam size for one beam shot. When the size of a pattern to be written by exposure and a system beam size are determined, the number of shots for exposing the pattern and a beam size for each shot are automatically determined according to the pattern rules.

For example, if the system beam length is 2 micrometers and a maximum length of the pattern to be exposed is 5 micrometers, the number of shots will be 3 and the beam length of each shot will be 1.667 . . . .

According to the pattern rules, the number of shots and the beam length of each shot are calculated and stored in pitch memories in advance. This calculation will be made in the direction of an X or a Y axis.

In the above exposure system, exposure time is generally proportional to the number of beam shots. It is, therefore, advantageous in the above technique (2) that the squares to be shot with large beams are as large as possible (but not exceeding the maximum beam size), and that the remaining small triangles are shot with beams whose lengths gradually shorten in a non-scanning direction. This may reduce the number of shots and the exposure time.

The above prior-art technique (2) will be explained more precisely. The following explanations are similarly applicable for the prior-art technique (1).

In FIG. 5(C), a right triangle pattern is to be generated by scanning along an X axis. Two sides of the triangle have lengths X2 and Y2, respectively. A maximum beam length Sx for one shot is set by equally dividing the length X2 into, for example, three segments according to data stored in the pitch memories. Small triangles A1, A2, and A3 are defined in the right triangle. These small triangles are generated with variable rectangular beams. The variable rectangular beams have a fixed width Sy in a non-scanning direction, i.e., along an Y axis, and the lengths of the variable rectangular beams shorten row by row by $\Delta X$.

Squares B1, B2, and B3 defined in the right triangle have sides each having a length of the maximum beam length Sx for one shot.

The beam width Sy along the Y axis is determined by equally dividing the length Y2 of the right triangle according to data stored in a non-rectangular pitch memory.

A left-lower corner 0 of the right triangle pattern is defined as a start point, and coordinates (X1, Y1) of the start point are stored in a memory. A coordinate system for all the squares and narrow rectangles to be generated is based on the start-point coordinates.

A first one of the variable rectangular beams for patterning the small triangles A1, A2, and A3 has, therefore, a start point at the coordinates (X1, Y1), a second one at (X12, Y12), a third one at (X13, Y13), and so on. With these rectangular beams, the small triangles A1, A2, and A3 are written. On the other hand, each of the squares B1, B2, and B3 is written with a square beam with each side having the length Sx. In this way, the right triangle pattern is written. This pattern may similarly be written along the Y axis.

The present invention provides a method of easily generating a pattern of optional angle, on the basis of the prior-art techniques.

A principle of the present invention is to select a reference angle (45 degrees) triangle pattern of required size, prepare data of rectangular and narrow rectangular beams necessary for writing the reference triangle pattern, and multiply the prepared data related to the sizes and start-point coordinates of the respective beams by optional angle data, i.e., tan $\theta$, thereby providing data for writing the pattern of optional angle.

A first embodiment of the present invention will be explained with reference to the composite of FIGS. 1A and 1B.

To generate a required triangle pattern, a reference triangle is selected first. The length along the X or Y axis and coordinates of each narrow rectangular beam necessary for forming the reference triangle are calculated, one by one. The length is multiplied each time by optional angle data such as tan $\theta$ related to the required triangle pattern, thereby finding the length and coordinates of each narrow rectangular beam for writing the required triangle pattern. The reference triangle has side lengths X2 and Y2 where X2=Y2, and an angle $\theta$ where tan $\theta = 1$. The optional angle of the required triangle pattern is allowed to vary, for example, from zero to 90 degrees. Namely, a tangent of the optional angle ranges from zero to infinity, so that one need not specify the angle precisely.

To reduce memory requirements in pattern generation, it is necessary to compress all necessary data into a predetermined number of bits. To achieve this, the present invention adopts a fixed data configuration of 8 or 16 bits.

When the optional angle exceeds 45 degrees, the number of data for tan $\theta$ increases considerably. This may hinder correct data processing. If the number of bits is cut away haphazardly, errors may occur. To deal with these problems, the present invention always maintains the optional angle $\theta$ below 45 degrees, i.e., tan $\theta$ of the optional angle $\theta$ below 1. For this, the present invention determines a scanning direction of a reference triangle according to the shape and angles of a required triangle pattern, such that tan $\theta$ of an optional angle $\theta$ is a value less than 1.

Figure 1B:
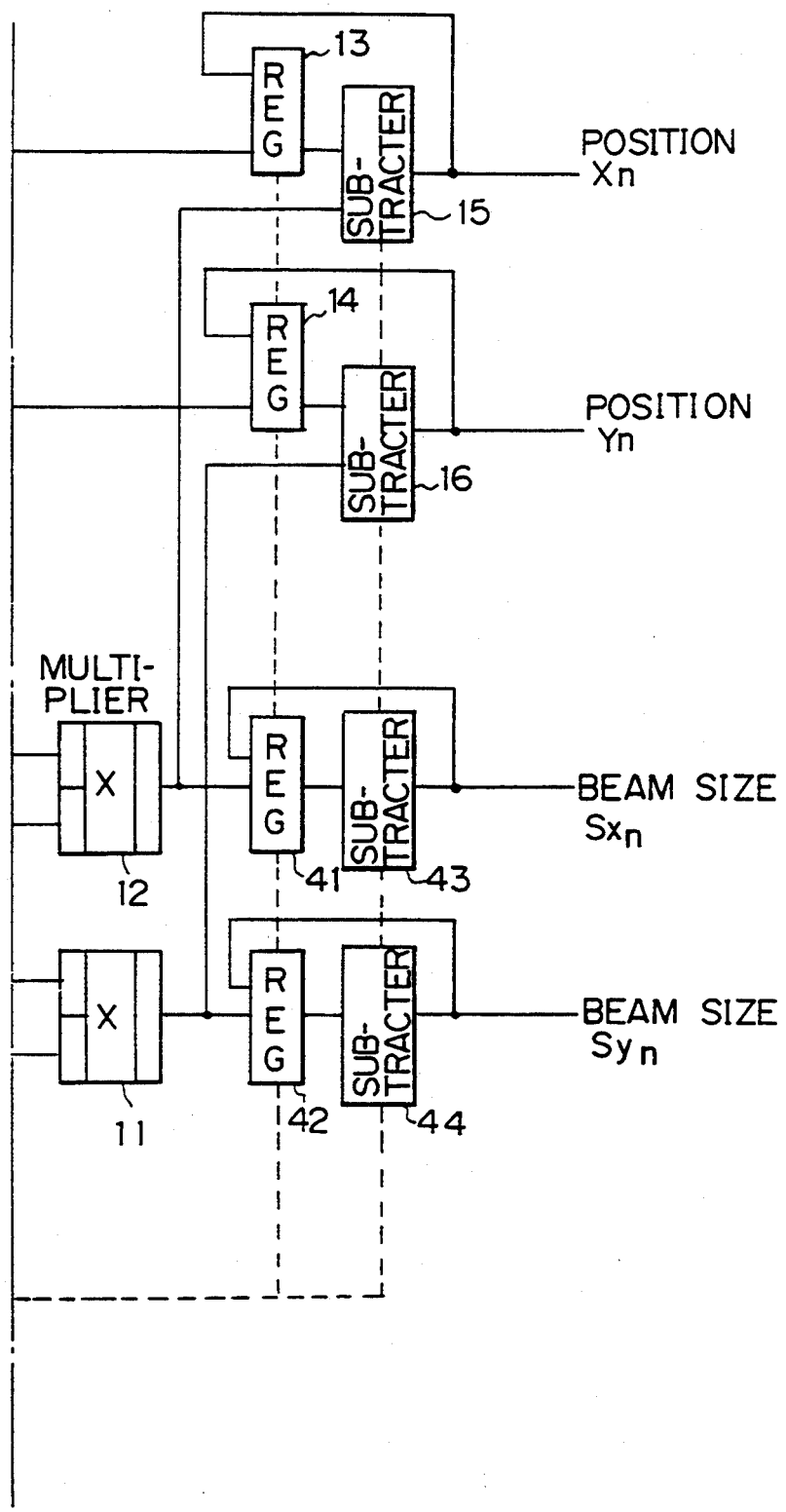
FIG. 1 is a block diagram showing a system for generating patterns having optional angles according to a first embodiment of the present invention.
Figure 8A:
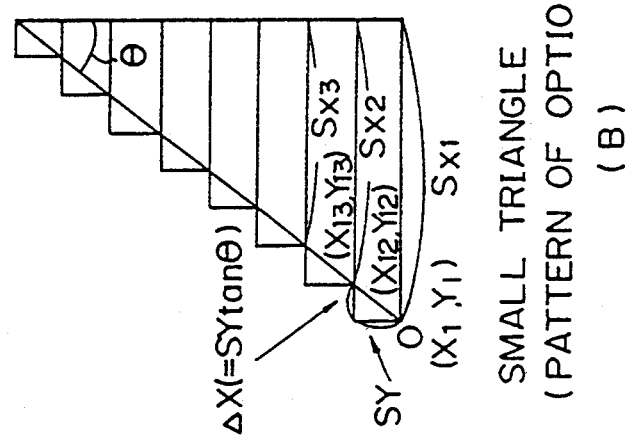
FIGS. 8A and 8B are views explaining a principle of generating a small triangle.

The present invention stores coordinates (X1, Y1) of a start point of a reference right triangle (FIG. 8(A)) in registers 1 and 2, respectively, of FIG. 1A. The coordinates (X1, Y1) are compared with subtrahends for axes X and Y provided by multipliers 11 and 12 (FIG. 1B), and the subtrahends are added to or subtracted from the coordinate, thereby successively updating start-point coordinates of respective rectangular beams.

Side lengths X2 and Y2 of the reference right triangle are stored in registers 3 and 4, respectively. According to the side lengths X2 and Y2, an X-axis pitch memory 5 or a Y-axis pitch memory 6 is accessed to obtain a maximum beam size Sx for rectangles B1, B2, and B3 and small triangles A1, A2, and A3 (FIG. 5(C)).

A left-lowest rectangle of the small triangle has a length of Sx along the X axis and a width Sy along the Y axis. The width Sy is a fixed value obtainable by accessing a non-rectangular pitch memory 7, the pitch memory 7 being for calculating the sizes of beams for writing non-rectangular patterns. The pitch memory 7 may be switched for the X or Y axis through a switch 20 in response to an output of a control signal generator 8, according to conditions required for bringing $\theta$ below 1.

Figure 6B:
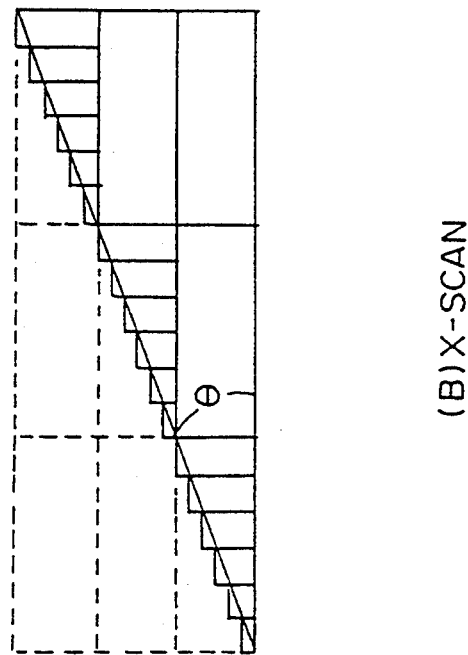
FIGS. 6A and 6B are views showing an example of a triangle having an optional angle.
Figure 6A:
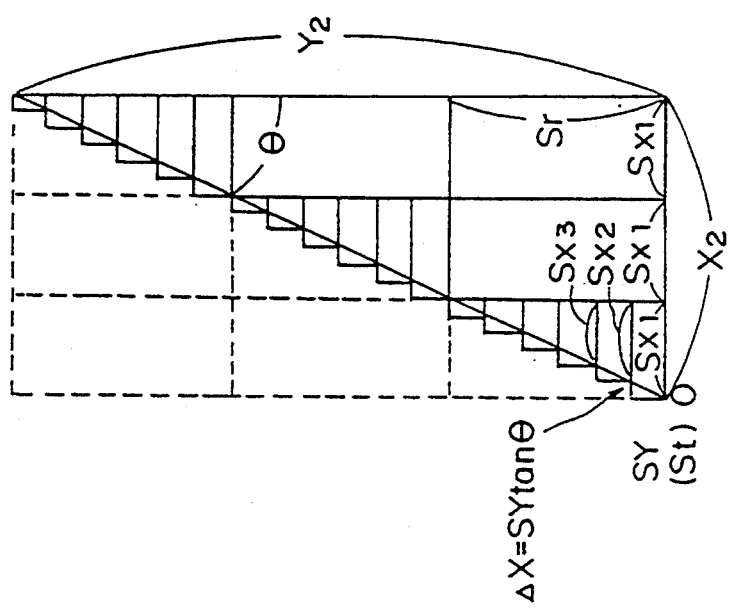

Data stored in an optional angle register 9 (FIG. 1A) is supplied to the multiplier 12 through a switch 10 in response to an output of the control signal generator 8, and $\Delta X$ (= Sy x tan $\theta$) is subtracted from the length Sx along the X axis of the rectangular beam. This operation is repeated to write the required triangle pattern (FIGS. 6(A) and 6(B)). In writing the pattern along the Y axis, the multiplier 11 is activated.

In this way, the size along the X axis of each rectangular beam is properly adjusted for the optional angle $\theta$, and coordinates (X1n, Y1n) of each rectangular beam pattern are corrected, according to outputs of the multipliers, to proper values for the required pattern.

In this embodiment, tan $\theta$ is multiplied every time to obtain the change $\Delta X$ for calculating the length along the X axis of a rectangular beam. This may accumulate errors and provide a final pattern that contains a considerably large error. Namely, in this embodiment there is a probability of providing an incorrect pattern.

This problem is solved by a second embodiment of the present invention.

The second embodiment selects a reference triangle, for example, an isosceles right triangle in patterning a triangle of optional angle. According to the side lengths X2 and Y2 and start-point coordinates (X1, Y1) of the reference triangle, the reference triangle is divided into a plurality of narrow rectangles and rectangles (squares). In the last stage, data for the X or Y axis are collectively multiplied by optional angle data, i.e., tan $\theta$, thereby providing data for a required triangle pattern of optional angle at one time. Rectangular and narrow rectangular beams are sequentially emitted according to the provided data to write the required pattern of optional angle.

Figures 2, 2A:
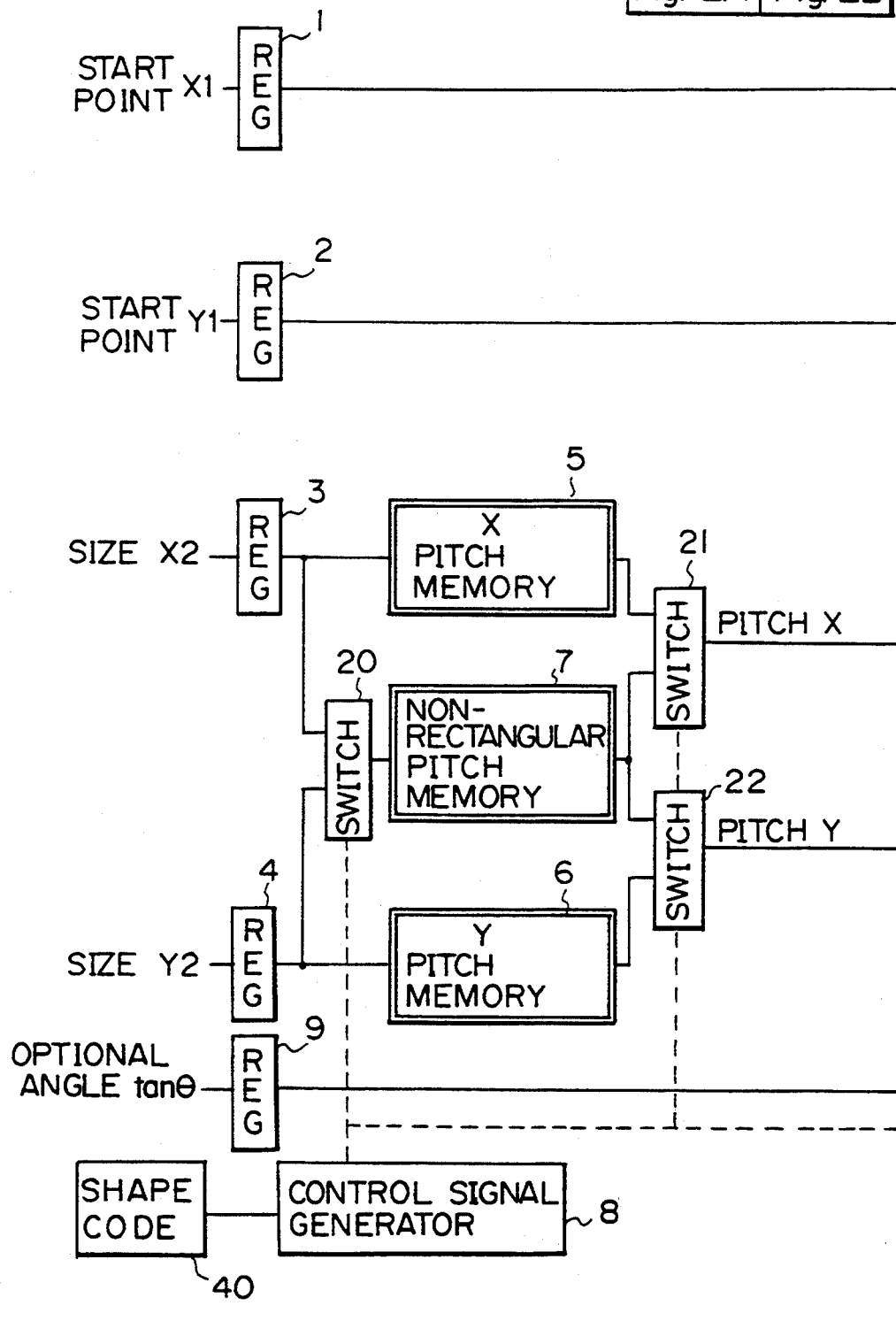
FIG. 2 is a block diagram showing a second embodiment of the present invention.

The second embodiment of the present invention will be explained more precisely with reference to the composite of FIGS. 2A and 2B and FIG. 5(C).

A reference pattern is generated first. For this purpose, X and Y pitch memories 5 and 6 of FIG. 2A are accessed according to side lengths X2 and Y2 along the X and Y axes of the reference pattern (FIG. 5(C)), thereby determining dimensions along the X and Y axes of a beam. In this reference pattern, X2=Y2, and tan $\theta = 1$.

As a result, the size Sx of a beam for each of rectangles B1 to B3 is determined. A switch 21 or 22 is activated depending on the scanning direction. For each of the small triangles A1 to A3, the size Sy in a non-scanning direction of the beam is determined by accessing a non-rectangular pitch memory 7 through a switch 20. The size in the scanning direction of a narrow rectangular beam for a lowest row of the small triangle is equal to the beam size Sx stored in the pitch memory.

According to the above data, a plurality of beams necessary for writing the reference isosceles right triangle are generated at once, and the coordinates and size of each of the beams are stored in a memory (not shown). Namely, the length Sx1 along the X axis of a narrow rectangular beam for a lowest row of the small triangle is equal to the value Sx stored in the pitch memory 5, and the length along the Y axis of the same beam is equal to the value Sy stored in the pitch memory 7.

Figure 2B:
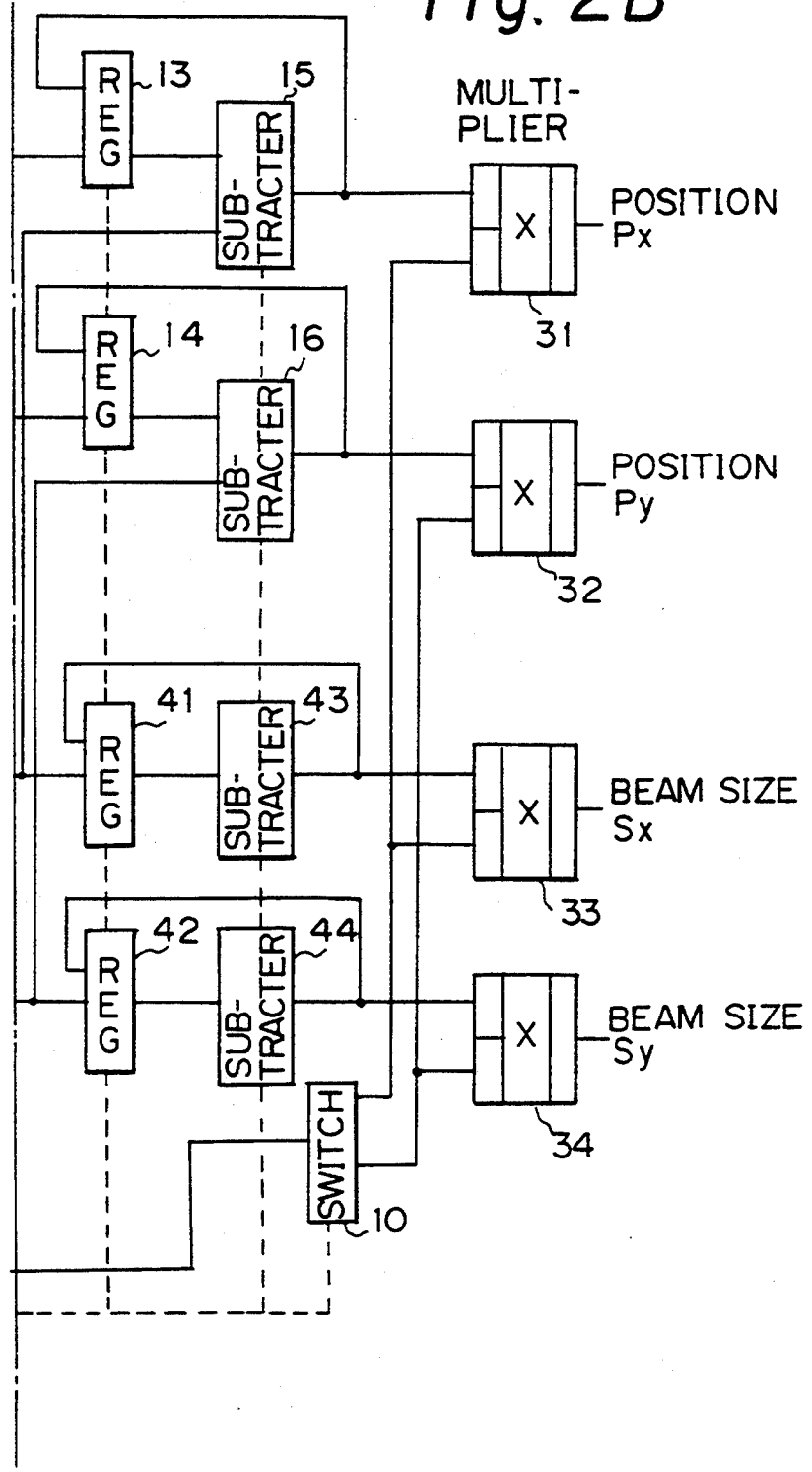
Figure 8B:
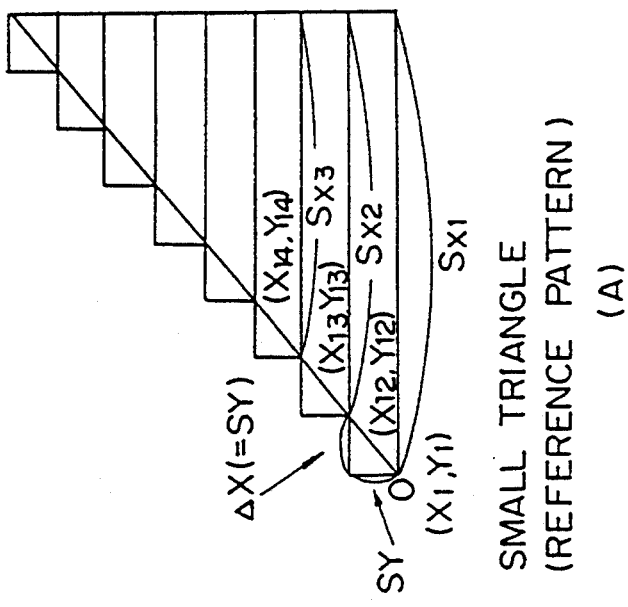

The length Sx2 of a narrow rectangular beam for the second row from the bottom (FIG. 8(A)) is obtainable from (Sx2=Sx1−Sy) with the use of a register 41 and a subtracter 43, or a register 42 and a subtracter 44 FIG. 2B. This operation is repeated until a narrow rectangular beam for the top row is obtained. Thereafter, outputs for axis X, i.e., the lengths and coordinates of the beams, are multiplied by tan $\theta$ of a required optional angle $\theta$ to provide final outputs for forming a small triangle of optional angle (FIG. 8(B)).

Similar to the small triangle, a component along the X axis of the rectangle is also multiplied by tan $\theta$ to provide a required triangular pattern of optional angle.

Input data format of the required pattern of an optional angle is, for example, as follows:

operation code: 16 bits
start point X1: 16 bits
start point Y1: 16 bits
size X2: 16 bits
size Y2: 16 bits
tan $\theta$ of optional angle $\theta$: 16 bits The operation code used for the present invention involves a pattern mode (a pattern of reference angle, a pattern of optional angle, etc.,) a pattern shape code, an irradiation correction code, etc.

Data of the small triangles A1, A2, and A3 of the above embodiment are expressed as follows:

| No. | Beam size X | Beam size Y |
|---|---|---|
| | Reference triangle | |
| 1 | Sx1 = Sx | Sy |

-continued

| No. | Beam size X | Beam size Y |
|---|---|---|
| 2 | Sx2 = Sx1 − Sy | " |
| 3 | Sx3 = Sx2 − Sy | " |
| ⋮ | ⋮ | ⋮ |
| ⋮ | ⋮ | ⋮ |
| n | Sxn = Sxn-1 − Sy | ⋮ |
|   | Final outputs |  |
|   | Sx1' = Sx1 × tan$\theta$ | Sy |
|   | Sx2' = Sx2 × tan$\theta$ | Sy |
|   | Sx3' = Sx3 × tan$\theta$ | Sy |
|   | ⋮ | ⋮ |
|   | Sxn' = Sxn × tan$\theta$ | ⋮ |

According to the present invention, the width in the non-scanning direction of a rectangular beam provided by the non-rectangular pitch memory is preferable to be as small as possible so as to smooth an oblique line of a triangle to be written. If the width is too narrow, however, the number of shots increases. A proper width will be about 0.2 micrometers.

When a parallelogram pattern of optional angle is required, dimensions along the X and Y axes are similarly obtained from the rectangular pitch memories, and the obtained data are lastly multiplied by tan $\theta$, thereby providing the required parallelogram pattern.

To improve processing efficiency in generating a pattern according to the present invention, it is possible to use the data and start point coordinates (X1, Y1) of only one of two orthogonal sides (along an X or Y axis) of a reference isosceles right triangle, and data for the X and Y axes are finally computed using switches.

Figure 3A:
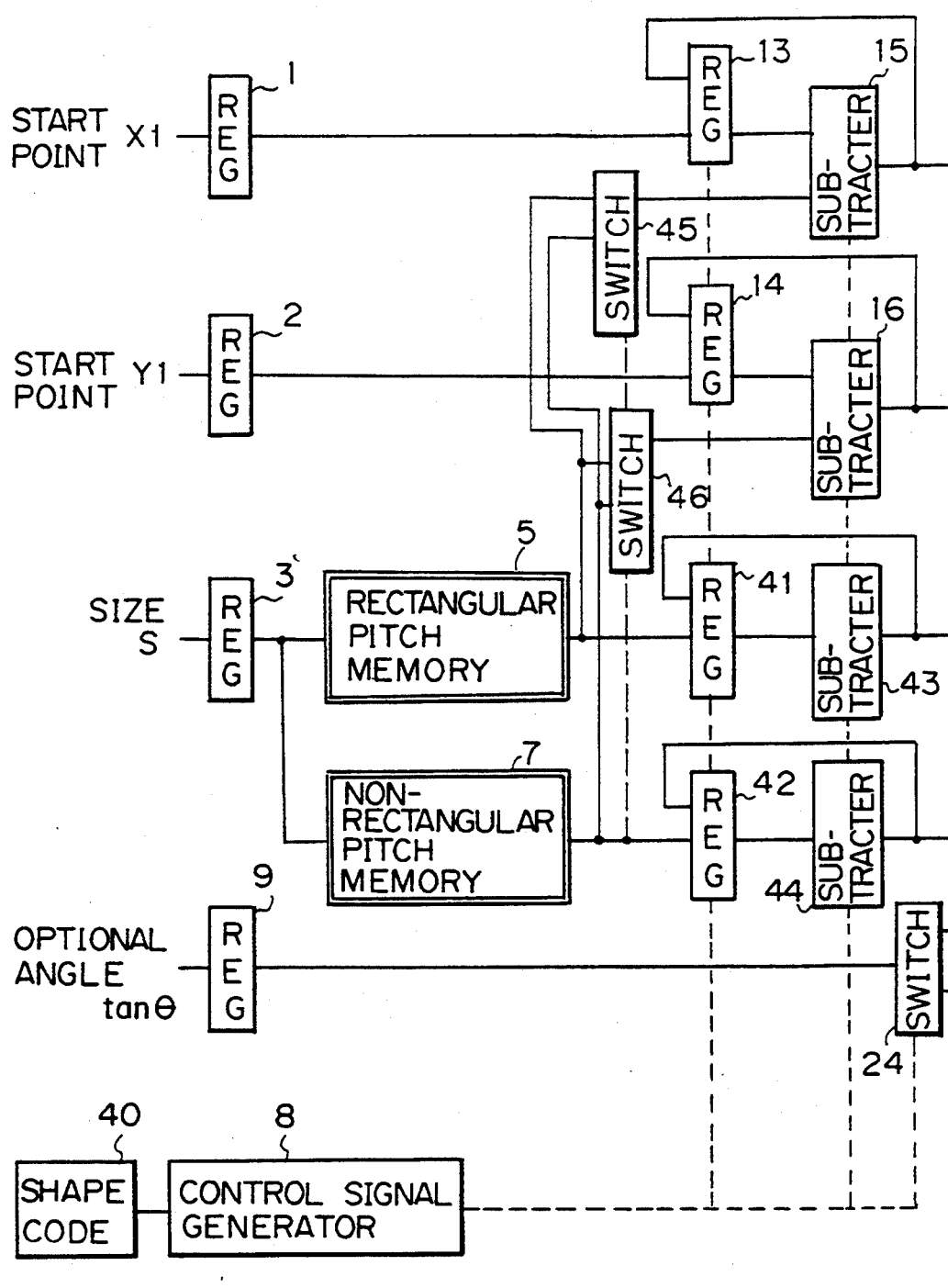
FIG. 3 is a block diagram showing a third embodiment of the present invention.

To achieve this idea, the present invention provides a third embodiment of the composite of FIGS. 3A and 3B. This embodiment uses the fact that an isosceles right triangle has two sides X2 and Y2 where X2=Y2, and tan $\theta$=1. The third embodiment uses only the length S of one side of a reference isosceles right triangle, and simultaneously accesses rectangular and non-rectangular pitch memories 5 and 7, and obtains the dimensions of beams for rectangles and small triangles through registers 41 and 42, and subtracters 43 and 44.

In the end, similar to the second embodiment, a switch 24 is controlled in response to a control signal to validate data for the X or Y axis and multiply the coordinates and dimensions of beams by optional angle data, i.e., tan $\theta$, in multipliers 31 to 34, thereby providing data for writing a required pattern of an optional angle.

In this embodiment, only the data S of one side of the reference isosceles right triangle is sufficient as the input pattern data. Namely, the input pattern data will be written with the following five words:
operation code: 16 bits
start point X1: 16 bits
start point Y1: 16 bits
size S: 16 bits
optional angle $\theta$: 16 bits This embodiment can, therefore, drastically reduce memory capacities necessary for pattern generation.

According to the present invention, efficiency of the above embodiment can be further improved by using a plurality of shape codes related to triangular patterns, and a combination of switches.

Figure 4B:
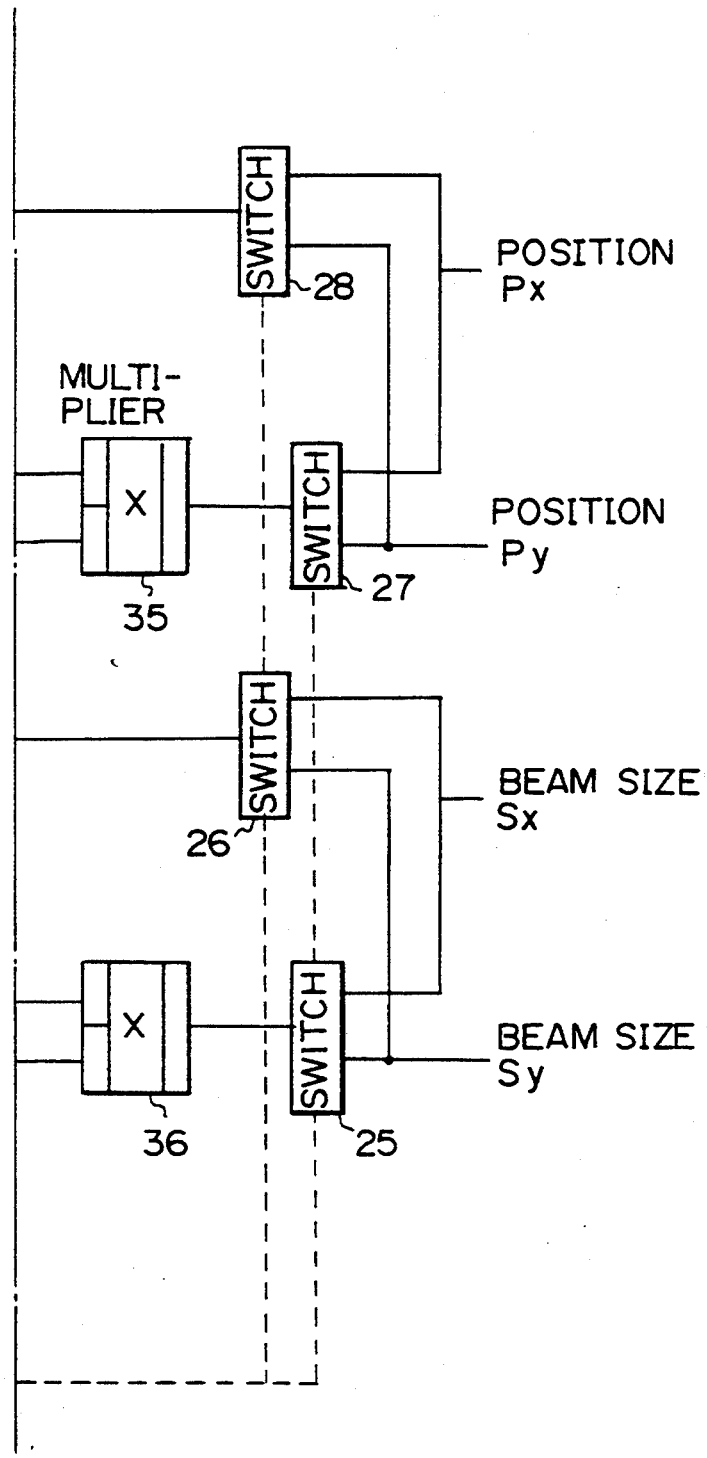
FIG. 4 is a block diagram showing a fourth embodiment of the present invention.

To achieve this, a fourth embodiment of the present invention will be explained with reference to the composite of FIGS. 4A and 4B.

This embodiment generates only one reference isosceles right triangle. According to the size S of the triangle, a rectangular pitch memory 5 provides the size Sr of a rectangular beam, and a non-rectangular pitch memory 7 provides the size St of the beam in a non-scanning direction. The size and coordinates of the obtained beam are multiplied by tan $\theta$, i.e., data of an optional angle of a required pattern. Data for one or both of axes X and Y may be exchanged with each other, or their positive and negative polarities can be inverted using switches 25 to 28 according to a shape code provided by a control signal generator 8, thereby providing the pattern of optional angle.

In the first to third embodiments, it is necessary to provide an orientation for a reference triangle before processing the triangle. In the fourth embodiment, however, there is provided only a means for generating a single reference triangle, and based on this triangle, eight different reference triangles are prepared as shown in FIG. 7 in response to shape codes.

The sizes and start-point coordinates of beams for a reference triangle are insufficient to determine the orientation of a required pattern. To deal with this, the fourth embodiment uses eight triangles as shown in FIG. 7. Each of the triangles has a shape code and data mentioned below. In each triangle, beams are scanned from larger ones to smaller ones as indicated with arrow marks in FIG. 7. A reference position to start-point coordinates of each triangle is a zero point of the triangle.

| No. | Beam size Xn change | Beam size Yn change | Position X addition | Position Y addition |
|---|---|---|---|---|
| 1 | Sr × tan $\theta$ | St | Px | Py |
| 2 | Sr × tan $\theta$ | St | Fixed | Py |
| 3 | Sr × tan $\theta$ | St | Px | −Py |
| 4 | Sr × tan $\theta$ | St | Fixed | −Py |
| 5 | St | Sr × tan $\theta$ | −P'x | Fixed |
| 6 | St | Sr × tan $\theta$ | P'x | Fixed |
| 7 | St | Sr × tan $\theta$ | −P'x | P'y |
| 8 | St | Sr × tan $\theta$ | P'x | P'y | where
Sr: output of rectangular pitch memory
St: output of non-rectangular pitch memory
tan $\theta$: X2/Y2 for Nos. 1 to 4
Y2/X2 for Nos. 5 to 8
Px=(X1−St×tan $\theta$)
P'y=(X1−St×tan $\theta$)

As explained above, the present invention employs no complicated control system and does not increase required memory capacities in implementing a pattern generating subsystem that can easily and precisely form various triangles of optional angles in a short time.

We claim:

1. In a charged particle exposure system having a first memory means (3, 4) for storing dimensional data (X2, Y2) of an input pattern, a second memory means (1, 2) for storing start-point coordinate data (X1, Y1) of the input pattern, a pitch memory (5, 6, 7), connected to said first memory means, for determining dimensions (Sx, Sy) of a rectangular beam pattern in scanning and non-scanning directions, a means for calculating coordinates of rectangular beam patterns according to the dimensional data stored in the pitch memory and the start-point coordinate data stored in the second memory means, and a multiplier for independently changing at least one of the dimensions of each of the rectangular beam patterns along an X or Y axis and the start-point coordinates of the rectangular beam pattern according to optional angle generating data, a method for generating exposure data of a plurality of the rectangular beam patterns to form a required right triangle pattern having a predetermined angle, comprising the steps of:

selecting the dimensions (Sx, Sy) in scanning and non-scanning directions of a reference rectangular beam pattern to form an isosceles right triangle pattern from the pitch memory according to the required right triangle pattern;

specifying the dimensions and start-point coordinates of the reference rectangular beam pattern:

calculating the dimensional and coordinate data of a plurality of the rectangular beam patterns to form the required right triangle pattern having the predetermined angle by using a multiplier in which one of the dimensions of the required rectangular beam pattern along X or Y axis is obtained according to a value of tan $\theta$ of the angle; and generating exposure data of a plurality of the rectangular beam patterns to form the required right triangle pattern having said predetermined angle.

2. The method as set forth in claim 1, further comprising the steps of:

repeating the calculating step thereby to obtain the dimensions and the start-point coordinates of all rectangular beam patterns necessary to form the required right triangle patterns.

3. The method as set forth in claim 1, further comprising the steps of:

calculating the dimensions and start-point coordinates of the required rectangular beam pattern as the isosceles right triangle pattern;

calculating the dimensions and start-point coordinates of a plurality of the required rectangular beam pattern as the isosceles right triangle pattern;

processing, with use of the multiplier and the value of tan $\theta$ of the angle, the required rectangular beam patterns as the isosceles right triangle to obtain exposure data of a plurality of the rectangular beam patterns to form a required right triangle pattern having said predetermined angle.

4. The method as set forth in claim 1, wherein said selecting step is carried out utilizing the pitch memory comprising a rectangular pitch memory for calculating the maximum dimensions of a rectangular beam for forming a rectangular pattern, and a non-rectangular pitch memory for calculating the length in a non-scanning direction of a narrow rectangular beam for forming a non-rectangular pattern.

5. In a charged particle exposure system having a first memory means (3, 4) for storing dimensional data (X2, Y2) of an input pattern, a second memory means (1, 2) for storing start-point coordinate data (X1, Y1) of the input pattern, pitch memory means (5, 6, 7) for determining respective dimensions (Sx, Sy) of a rectangular beam pattern in scanning and non-scanning directions, means for calculating coordinates of rectangular beam patterns according to the dimensional data stored in the pitch memory and the start-point coordinate data stored in the second memory means, and a multiplier for independently changing at least one of the dimensions of each of the rectangular beam pattern along an X axis or a Y axis and the start-point coordinates of the rectangular beam pattern according to variable angle generating data relating to desired right triangle patterns to be exposed in accordance with the relative dimensions of the legs thereof respectively in the X axis and Y axis directions, a method for generating exposure data of a plurality of the rectangular beam patterns to form a desired right triangle pattern having respective legs in the X axis and Y axis directions having a corresponding and fixed dimensional ratio therebetween defining a corresponding, fixed angle, comprising the steps of:

selecting the respective dimensions (Sx, Sy) in scanning and non-scanning directions of a reference rectangular beam pattern to form an isosceles right triangle pattern from the pitch memory according to the desired right triangle pattern;

specifying the dimensions and start-point coordinates of the reference rectangular beam pattern:

calculating the dimensional and coordinate data of a plurality of the rectangular beam patterns to form the desired right triangle pattern having the fixed angle by using a multiplier in which one of the dimensions of the required rectangular beam pattern, respectively along X and Y axes, is obtained according to a value of the tangent of the fixed angle; and generating exposure data of a plurality of the rectangular beam patterns to form the required right triangle pattern having the fixed angle.

6. The method as set forth in claim 5, further comprising the steps of:

repeating the calculating step thereby to obtain the dimensions and the start-point coordinates of all rectangular beam patterns necessary to form the desired right triangle patterns.

7. The method as set forth in claim 5, further comprising the steps of:

calculating the dimensions and start-point coordinates of the desired rectangular beam pattern as the isosceles right triangle pattern;

calculating the dimensions and start-point coordinates of a plurality of the required rectangular beam patterns as the isosceles right triangle pattern;

processing, with use of the multiplier and the value of the tangent of the angle, the required rectangular beam patterns of the isosceles right triangle to obtain exposure data of a plurality of the rectangular beam patterns to form the desired right triangle pattern having the fixed angle.

8. The method as set forth in claim 5, wherein said selecting step is carried out utilizing the pitch memory comprising a rectangular pitch memory for calculating the maximum dimensions of a rectangular beam for forming a rectangular pattern, and a non-rectangular pitch memory for calculating the length in a non-scanning direction of a narrow rectangular beam for forming a non-rectangular pattern.

9. The method as set forth in claim 8, wherein the dimension and start-point coordinate along only one axis X or Y are used in forming the required pattern.

10. The method as set forth in claim 9, wherein shape codes representing specific triangles, respectively, are used.

* * * * *